US011933834B2

(12) United States Patent
Bergeron

(10) Patent No.: US 11,933,834 B2
(45) Date of Patent: Mar. 19, 2024

(54) METHOD AND SYSTEM FOR DETECTING SELF-CLEARING, SUB-CYCLE FAULTS

(71) Applicant: 3M INNOVATIVE PROPERTIES COMPANY, St. Paul, MN (US)

(72) Inventor: Phillip J. Bergeron, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 107 days.

(21) Appl. No.: 17/757,252

(22) PCT Filed: Dec. 30, 2020

(86) PCT No.: PCT/IB2020/062542
§ 371 (c)(1),
(2) Date: Jun. 13, 2022

(87) PCT Pub. No.: WO2021/137169
PCT Pub. Date: Jul. 8, 2021

(65) Prior Publication Data
US 2023/0003784 A1     Jan. 5, 2023

Related U.S. Application Data

(60) Provisional application No. 62/955,486, filed on Dec. 31, 2019.

(51) Int. Cl.
*G01R 31/08* (2020.01)
*G01R 19/10* (2006.01)
(Continued)

(52) U.S. Cl.
CPC ............ *G01R 31/085* (2013.01); *G01R 19/10* (2013.01); *G01R 19/16571* (2013.01); *H02J 13/00001* (2020.01); *H02J 13/00002* (2020.01)

(58) Field of Classification Search
CPC ............................ G01R 31/085; G01R 19/10; G01R 19/16571; G01R 19/04; G01R 19/2513;
(Continued)

(56) References Cited

U.S. PATENT DOCUMENTS

| 2012/0185185 A1* | 7/2012 | Bae ......................... H04Q 9/00 702/58 |
| 2014/0266271 A1* | 9/2014 | Stagi ....................... G01R 31/58 324/750.01 |

(Continued)

*Primary Examiner* — Alvaro E Fortich
(74) *Attorney, Agent, or Firm* — Gregg H. Rosenblatt

(57) ABSTRACT

A method of detecting self-clearing, sub-cycle faults comprises sensing a current condition and a voltage condition at a location along a power cable. The sensed conditions are relayed to an analyzing device, the analyzing device including a current peak detector. The presence of a measured current value is determined. If the measured current value is greater than a current threshold value, a faulted circuit indicator (FCI) analysis is performed to determine the presence or absence of an FCI fault. If an FCI fault is absent, an incipient fault analysis is performed, wherein the RMS current values before and after a threshold event are compared and the voltage total harmonic distortion (THD) before and after the event are compared. If the two current values are within a first predetermined percentage and the THD values differ by a second predetermined percentage, then an incipient fault is reported. If either the two current values are not within the first predetermined percentage or the THD values do not differ by at least the second predetermined percentage,

8 Claims, 3 Drawing Sheets

(51) Int. Cl.
  *G01R 19/165* (2006.01)
  *H02J 13/00* (2006.01)
(58) Field of Classification Search
  CPC ............... G01R 19/02; H02J 13/00001; H02J 13/00002; Y02E 60/00; Y04S 10/30
  See application file for complete search history.

(56) References Cited

U.S. PATENT DOCUMENTS

2019/0304673 A1* 10/2019 Neti ................... H01F 27/42
2020/0150158 A1* 5/2020 Beishline ......... G01R 19/16528
2020/0150163 A1* 5/2020 Beishline ............... G01R 13/02

* cited by examiner

METHOD AND SYSTEM FOR DETECTING SELF-CLEARING, SUB-CYCLE FAULTS

FIELD OF THE INVENTION

The invention relates to a method and system for detecting self-clearing, sub-cycle faults.

BACKGROUND

Traditional Faulted Circuit Indicators (FCIs) are used for detecting faults in electrical power distribution systems. These systems are designed to detect fault events that typically require a fault to last at least 1 full cycle (1/60 seconds) before detection occurs. Events called incipient faults which are self-clearing in nature and tend to last less than ½ a cycle can go above the fault trip threshold without being detected. These incipient faults can become more and more frequent over time leading to cable failure which causes a fault event and power outage to the neighboring area.

Incipient faults are caused by water penetrating defects in a splice or termination which causes an arcing fault. Water vapors caused by the high current evaporating the water extinguish the fault within the given time making the fault self-clearing. Because of this, incipient faults have several defining characteristics:

1. They typically last ¼ to ½ cycle.
2. They typically occur on only one phase of a 3-phase system.
3. Pre-fault and post-fault load conditions are reasonably similar.
4. Fault begins at or close to the apex of the voltage waveform.
5. Post fault voltage transients for a few (3 or 4) cycles after the fault.

SUMMARY OF THE INVENTION

According to a first aspect of the invention, a method of detecting self-clearing, sub-cycle faults, comprises sensing a current condition and a voltage condition at a location along a power cable. The sensed conditions are relayed to an analyzing device, the analyzing device including a current peak detector. The presence of a measured current value is determined. If the measured current value is greater than a current threshold value, a faulted circuit indicator (FCI) analysis is performed to determine the presence or absence of an FCI fault. If an FCI fault is absent, an incipient fault analysis is performed, wherein the RMS current values before and after a threshold event are compared and the voltage total harmonic distortion (THD) before and after the event are compared. If the two current values are within a first predetermined percentage and the THD values differ by a second predetermined percentage, then an incipient fault is reported.

In another aspect, if either the two current values are not within the first predetermined percentage or the THD values do not differ by at least the second predetermined percentage, an unclassified event is reported.

In another aspect of the invention, a system for detecting and communicating network conditions can include logic that performs the incipient fault detection method described above.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE FIGURES

The invention will now be described, by way of example only, and with reference to the following drawings, in which.

DETAILED DESCRIPTION OF THE INVENTION

The present disclosure provides a method and system for incipient fault detection that uses incipient fault logic in combination with a peak detector and traditional fault circuit indicator (FCI) logic for comparison to rule out fault conditions. The method includes calculation of total harmonic distortion (THD) just after the time of the disturbance for detection of transient voltages that are associated with incipient faults. Such analysis allows for comparison of load conditions before and after the event and for determining if the fault occurred near the apex of the voltage waveform. The method and system of the present invention also can detect incipient faults independent of waveform analysis techniques. The detection and identification of incipient faults in accordance with the method and system of the present invention can be utilized to predict future failure of a splice or termination and save customers from having unplanned outages and further equipment damage.

As described in further detail below, an exemplary system that employs a technique for communicating power quality, voltage and current magnitude, fault information, and other data back to a central server for processing can be used with the described incipient fault detection techniques. The system can alert the central server that an incipient fault has occurred and has been detected at a specific location (possibly multiple) with magnitude and accurate timestamp information and can keep track of the number of incipient fault events detected at that location. The system can provide information to a utility that can help them replace failing assets before a catastrophic fault event occurs and customers having to take an outage. This functionality would improve the overall grid reliability and save the customer time, resources, and/or money related to an outage.

Figure 1:
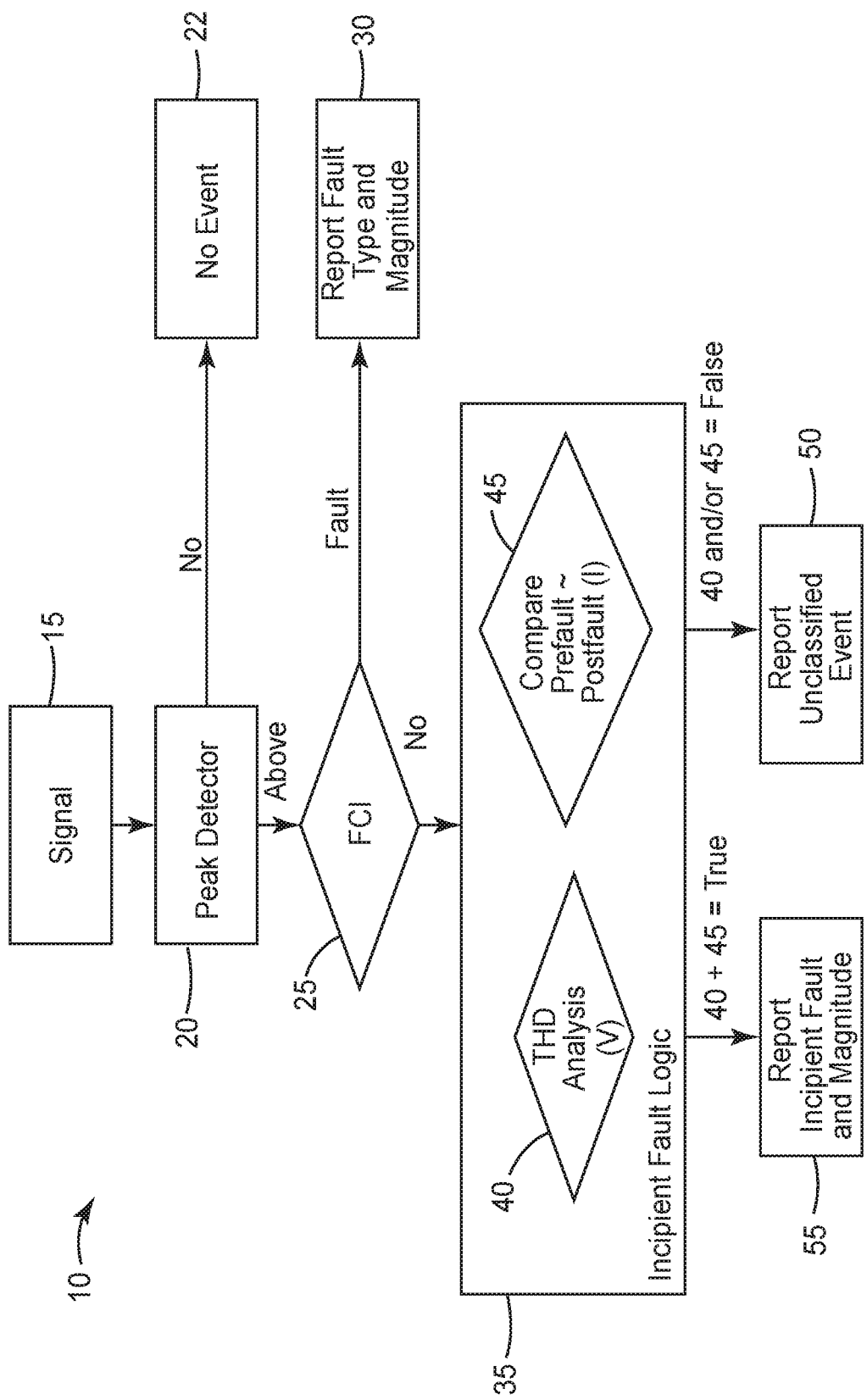
FIG. 1 is a flowchart showing a method of detecting a sub-cycle, self-clearing fault according to an embodiment of the present invention.

FIG. 1 is a flow chart of an exemplary method 10 of detecting self-clearing, sub-cycle faults. The method utilizes data collected by a peak detector circuit that allows for much faster than one cycle detection of peak magnitude.

Figure 4:
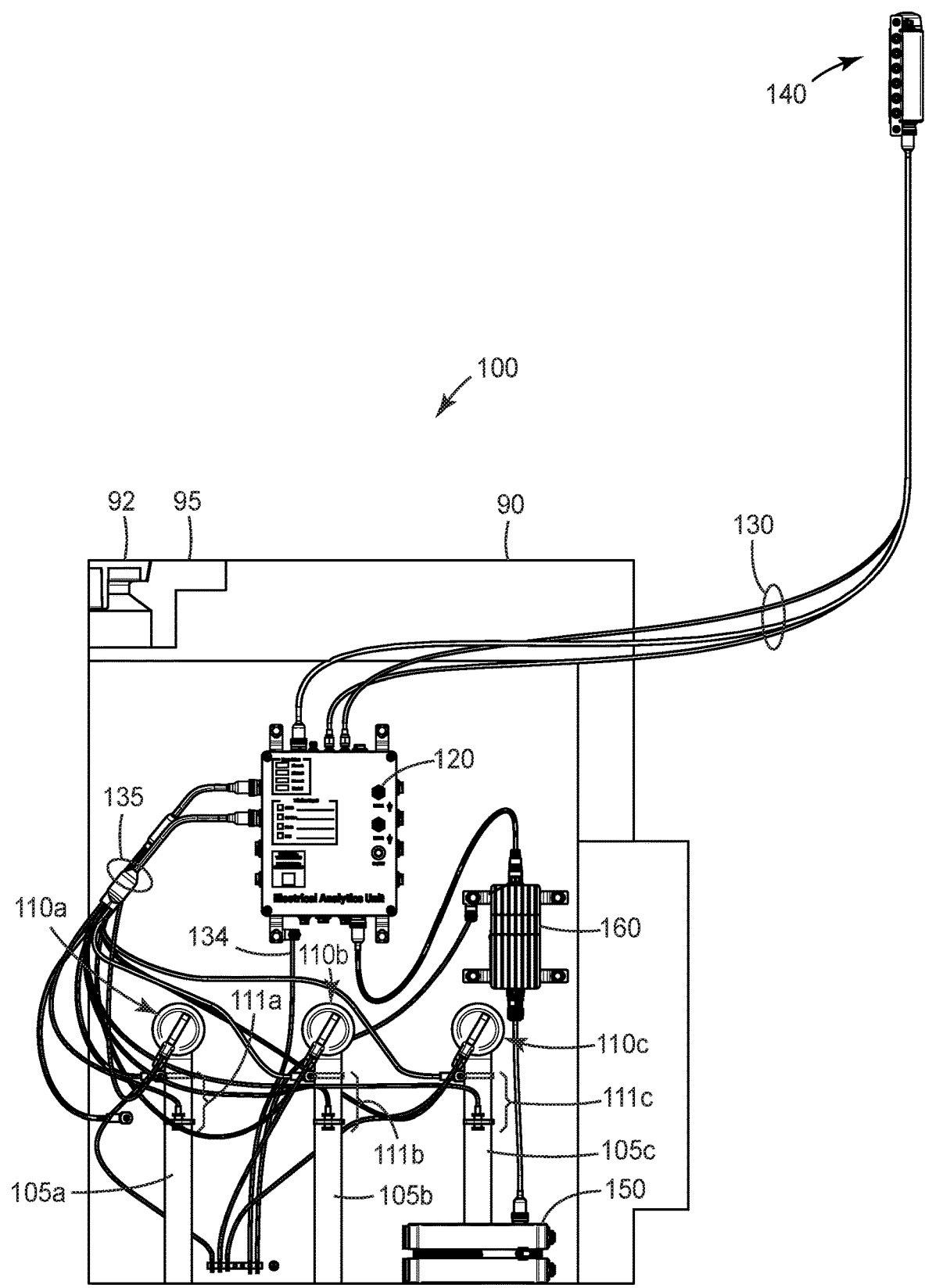
FIG. 4 is an exemplary detection and communication system that can detect a sub-cycle, self-clearing fault according to another embodiment of the present invention.

In step 15, a current condition and a voltage condition are sensed at a location along a power cable. For example, utilizing a system such as shown in FIG. 4, described in further detail below, current flowing through three phase conductors is measured by Rogowski coils and converted to a voltage relative to the amplitude of the current by an integration circuit.

Figure 2:
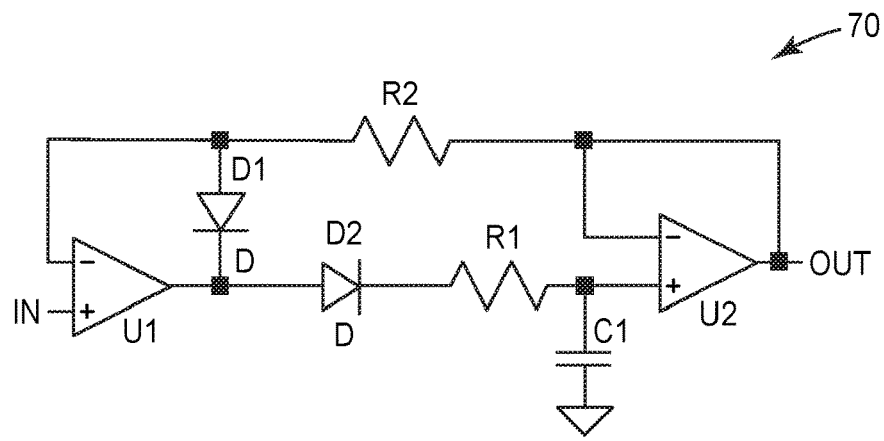
FIG. 2 show an exemplary peak detection circuit.

In step 20, the sensed conditions are relayed to an analyzing device. In a preferred aspect, the analyzing device, such as EAU 120, described further below, can include a current peak detector such as peak detector 70, shown in FIG. 2 (or similar circuitry, as would be apparent to one of skill in the art). A peak detector circuit uses operational amplifiers in combination with a series diode and capacitor to hold a voltage value relative to the peak input current. This configuration allows for a system to check the value of the peak detector periodically without missing the actual peak value. The peak detector circuit can be used to trigger an alarm when the peak value of the current crosses some predefined threshold.

If the peak value of the current does not cross the predefined threshold, no event is reported (step 22).

In an alternative embodiment of the invention, instead of or in addition to using a peak detector, the analyzing device can include a fast fault detector or high-speed sampling that is sufficient to measure ¼-½ cycle events.

Returning back to FIG. 1, if the peak value of the current crosses the predefined threshold, then in step 25, the system performs a conventional faulted circuit indicator (FCI) analysis to determine the presence or absence of an FCI fault (i.e., a fault detected using traditional FCI logic). If such a fault has occurred, then the analysis is complete and the system reports the fault and the peak magnitude detected by the peak detector circuit in step 30.

According to an aspect of the present invention, if the FCI logic does not determine a fault has occurred after the threshold, the incipient fault logic (step 35) begins and is performed in steps 40 and 45. In step 45, the RMS current values before and after the threshold event are compared. When the two current values are within a certain predetermined percentage, such as within 10% or within 15%, of each other, (or, alternatively, other predetermined percentage values) the incipient fault logic continues by comparing the Voltage total harmonic distortion (THD) before and after the event (step 40). If the two current values are within the certain percentage noted above (e.g., within 10% or 15%) and the THD values differ by a certain percentage, such as at least 30% or at least 25%, then an incipient fault is reported in step 55. If either the two current values are not within the noted percentage above or the THD values do not differ by at least the percentage noted above, then an "unclassified event" is reported in step 50.

As noted above, if the logic does not meet the criteria in these two cases, the "unclassified event" will be generated and reported back to a central server for further analysis. An unclassified event in this case would mean something that requires more attention, but that cannot be classified as an incipient fault by the algorithm.

As such, referring back to FIG. 1, as part of the incipient fault logic, in step 40, for example, a total harmonic distortion (THD) analysis is performed. If an FCI fault is absent, a first total harmonic distortion value related to the voltage of the power cable at the location at the time the measured current value crosses the current threshold value or a time thereafter (THD1) is compared to a total harmonic distortion related to the voltage of the power cable at the location at a time prior to the sub-cycle event (THD0) to generate a total harmonic distortion comparison value (THDc).

The THD can be calculated using the instantaneous RMS values using the following formula:

$$\frac{\sqrt{V_{rms}^2 - V_{rmsf}^2}}{V_{rmsf}}$$

where $V_{rms}$ is the RMS voltage including all measurable frequencies, and $V_{rmdf}$ is the RMS voltage of only the fundamental frequency (60 Hz in this case).

In more detail, for example, in step 45, a first current value ($I_0$) (from prior to the time the measured current value crosses the current threshold value) is compared to a second current value ($I_1$) (after the time the measured current value crosses the current threshold value). The difference between $I_1$ and $I_0$ is Ic. The pre and post fault RMS current values are compared for a percent change within some predefined threshold (e.g., are the current values with 10% of each other?). If the values are reasonably similar, an incipient fault has occurred and can be reported along with the measured peak current value.

In both steps 40 and 45, in further detail, circular buffers can be used for monitoring THD and RMS current during the time of an incipient fault. At all times during normal operation, a small buffer will be used to keep track of a certain number (e.g., 10 or so) of the most recent values at a rate of 5 samples per cycle (2 cycles of data). As each newest data point gets added to the front of the buffer, the oldest data gets pushed out of the buffer. In solely traditional FCI analysis, this data is not examined by the application.

At the time of an interrupt from the peak detector circuit to the CPU, a timer will start that lasts 1 cycle, and then copies the values from the circular buffer to a location that can be analyzed further and won't change. In this way, there are 5 samples from the cycle before the incipient fault, and 5 samples from the cycle just after:

| THD vals | time |
|---|---|
| THD_n | t_n |
| THD_n − 1 | t_n − 1 |
| THD_n − 2 | t_n − 2 |
| THD_n − 3 | t_n − 3 |
| THD_n − 4 | t_n − 4 |
| THD_n − 5 | t_n − 5 |
| THD_n − 6 | t_n − 6 |
| THD_n − 7 | t_n − 7 |
| THD_n − 8 | t_n − 8 |
| THD_n − 9 | t_n − 9 |

As the next value comes in:

| THD vals | time |
|---|---|
| THD_n + 1 | t_n + 1 |
| THD_n | t_n |
| THD_n − 1 | t_n − 1 |
| THD_n − 2 | t_n − 2 |
| THD_n − 3 | t_n − 3 |
| THD_n − 4 | t_n − 4 |
| THD_n − 5 | t_n − 5 |
| THD_n − 6 | t_n − 6 |
| THD_n − 7 | t_n − 7 |
| THD_n − 8 | t_n − 8 |

If a fault occurs at the above time, the copied data may look like below (elsewhere in memory) and in this example, the peak detector triggered at time t_n+2 (highlighted):

| THD vals | time |
|---|---|
| THD_n + 6 | t_n + 6 |
| THD_n + 5 | t_n + 5 |
| THD_n + 4 | t_n + 4 |
| THD_n + 3 | t_n + 3 |

-continued

| THD vals | time |
|---|---|
| THD_n + 2 | t_n + 2 |
| THD_n + 1 | t_n + 1 |
| THD_n | t_n |
| THD_n − 1 | t_n − 1 |
| THD_n − 2 | t_n − 2 |
| THD_n − 3 | t_n − 3 |

Thus, two separate but functionally identical buffers will be created and used for each phase being monitored, one for current/time values, and one for THD/time values.

When the incipient fault and corresponding magnitude are reported by the system, this report or notification can be sent as DNP3 binary input data point to a SCADA user.

The logic described above can be implemented in one or more logic circuits.

In more detail, the main types of logic described herein (and that can be employed in the logic/software/firmware of the system shown in FIG. 4 below) include Instantaneous and Time Overcurrent (TOC). Instantaneous means that the current crossed a threshold for at least one cycle (1/60 sec). Time Overcurrent means that there is some element of time involved in the trip logic. There can be two categories of TOC logics:
1. Definite Time Delay—means that a threshold must be crossed by the current for some preset amount of time before the FCI trips. For example, above 100A for 30 cycles.
2. Inverse Time Delay—means that the amount of time that it takes the FCI to trip is inversely proportional to the magnitude of the current. There are standard curves for determining the trip time provided by IEC and IEEE and these can be selected and configured by the user.

Figure 3A:
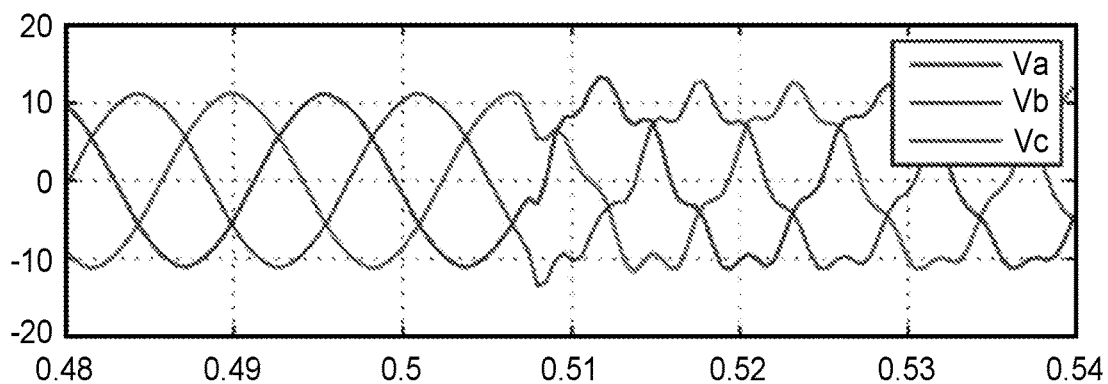
FIGS. 3A and 3B show conventional voltage and current waveforms of an incipient fault.
Figure 3B:
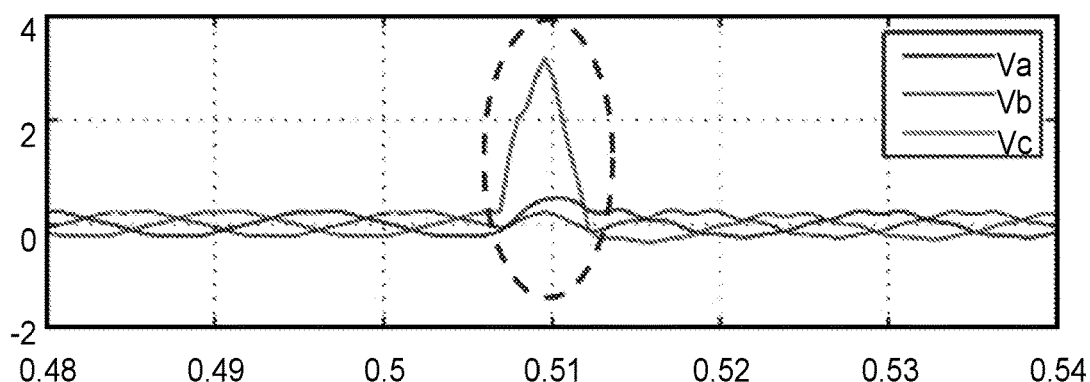

For reference purposes, an example incipient fault is shown in FIG. 3A (voltage waveforms) and FIG. 3 (current waveforms) in a standard three phase power distribution system. These example figures are further described in "Incipient Fault Location Algorithm for Underground Cables," IEEE Transactions on Smart Grid, Vol. 5, No. 3, May 2014. As shown, these incipient faults demonstrate the following features—the current lasts less than ½ cycle; the pre- and post-peak current values are of similar amplitude; and the voltage waveform has significant distortion (THD) after the peak occurs.

As described further below, the method described herein can be included as part of software or firmware that is loaded onto logic that is part of an analytics unit of a fault detection system. By implementing the incipient fault logic in a data communication and fault detection system, a value can be sampled and cleared hundreds of times per cycle. Once the threshold event has been detected, the system's FCI logic (which mimics mechanical FCI functionality and requires one full cycle for detection) can be used for comparison to rule out an FCI fault. Thus, a comparison of load conditions before and after the fault to within some percent change can be detected to show that the fault was self-clearing and didn't significantly affect the amount of current flowing through the system. This method can utilize RMS current measurements and an to algorithm for comparison, independent of waveform analysis. As such, digital processor(s) which have substantial power requirements do not need to be included in the fault detection system.

In another aspect of the invention, the aforementioned FCI analysis that includes detecting self-clearing, sub-cycle faults can be performed by the detection and communication system 100 shown in FIG. 4.

The system 100 can be utilized in an enclosure, such as a grade level, above ground or underground enclosure, that is used to house and protect utility assets, such as electrical equipment. In one aspect, the enclosure is an underground enclosure accessible via an entrance port and can include a separate vent pipe used to provide an exhaust outlet for gasses from the enclosure. The system 100 can be installed within the enclosure, and/or alternatively the vent pipe, to provide a means for communicating information about a condition, such as a fault or environmental condition, of the vault and or the utility asset disclosed therein. The communication can include a wireless communication, via a transceiver/antenna, and/or a visual communication, via a visible light indicator assembly, such as an LED array, disposed in or on the vent pipe. The mechanical packaging of the assembly and enclosure allows it to be installed into vent pipes at street level and is packaged for ingression protection. The antenna design allows it to transmit the signal through the vent pipe cover for security and anti-vandalism. The system 100 can include one or more sensors that provide data related to a real-time condition within the enclosure. In addition, a sensor analytics unit (also referred to as an electronic analytic unit) can process and analyze the real-time data from the one or more sensors and relay that processed data, including information about self-clearing, sub-cycle faults to the transceiver for communication outside of the enclosure.

In more detail, FIG. 4 shows one aspect of the present invention, a detection and communication system 100. In this aspect, the system 100 is installed in an underground enclosure, such as a vault or manhole, here underground vault 90. In this example implementation, enclosure or vault 90 includes a variety of equipment, such as switchgear for one or more high voltage electrical lines, such as electrical lines 105a-105c (carrying e.g., low, medium or high voltage power), associated components and/or accessories, such as a splice or termination (in the example of FIG. 4, three terminations 110a-110c will represent such associated components and/or accessories). Of course, a fewer or greater number of components can be provided in a such an enclosure. In some enclosures, a transformer may be included therein.

The enclosure or vault 90 can be accessed from above ground via a portal or entrance port 95 that includes a conventional manhole cover 92, which can be formed from a metal or non-metal, and can have a conventional circular shape. In a one aspect, the manhole cover can be mounted on a ring, frame or flange structure of the entrance port 95. In this aspect, vault 90 is can be constructed as a conventional underground vault, commonly used by electric, gas, water, and/or other utilities. However, in alternative aspects, the detection system 100 can be utilized in another type of underground enclosure or similar structure, such as a manhole, basement, cellar, pit, shelter, pipe, or other underground enclosure.

The vault also includes at least one sensor or monitoring device disposed therein which can monitor a physical condition of the vault or of the components or equipment located in the vault. Such conditions would normally be difficult to gather or assess from above-ground. The detection system can provide a communication infrastructure to relay vault condition information (1) to an above ground network or SCADA, without having a service technician physically enter the vault to determine those conditions, (2) to an above ground technician via a wireless or Bluetooth communication system, and/or (3) via a visible light communication assembly to an observing technician.

As shown in FIG. 4, in this example, terminations 110a-110c each provide a terminal connection for a power cable, such as a low, medium or high voltage power cable 105a-105c. The sensor(s) can include a sensor disposed on the termination. In this embodiment, sensors 111a-111c are provided. These sensors can provide sensing capabilities that measure a cable condition, such as voltage, current, and/or temperature. Thus, in this example, terminations 110a-110c can be referred to as sensored terminations 110a-110c that can provide real-time data about the condition of one or more connected power lines.

For example, one or more of the sensored terminations 110a-110c of this aspect can include one or more sensors 111a-111c. In one example, one or more sensors can comprise a Rogowski coil that produces a voltage that is proportional to the derivative of the current, meaning that an integrator can be utilized to revert back to a signal that is proportional to the current. Alternatively, a current sensor can be configured as a magnetic core current transformer that produces a current proportional to the current on the inner conductor. In addition, one or more of the sensored terminations can include a capacitive voltage sensor that provides precise voltage measurements. Because one or more of sensored terminations 110a-110c can include both a current sensor and a capacitive voltage sensor, the sensored terminations facilitate calculation of phase angle (power factor), Volt Amps (VA), Volt Amps reactive (VAr), and Watts (W). An exemplary sensored termination is described in U.S. Pat. No. 9,742,180, incorporated by reference herein in its entirety.

While the embodiment of FIG. 4 shows sensors implemented as part of a sensored termination, in other aspects of the invention, sensors can be implemented as part of a more general sensored electrical accessory, such as a cable termination, cable splice, or electrical jumper.

In addition, the system can include one or more sensors that comprise one or more of the following sensors: power, voltage, current, temperature, combustible materials or byproducts of combustion, mechanical strain, mechanical movement (e.g. revolutions per minute), humidity, soil condition (acidity, moisture content, mineral content), pressure, hazardous atmosphere, liquid flow, leakage, component end-of-life or lifetime (e.g., a cathodic protection sensor), personnel presence (e.g., has someone entered the enclosure), physical state (e.g., is the enclosure open or closed, is the door open or closed, is a switch or valve open or closed, has an item been tampered with), light sensor, vibration (seismic, tampering).

In another aspect, data is communicated from the sensors inside the enclosure to a network, SCADA, or service technician located outside the enclosure via a transceiver 140. In one aspect, the transceiver 140 can be incorporated in a transceiver device mounted in a vent pipe 15 (not shown) located outside the enclosure 90, at, e.g., a distance of 2-10 meters away. Alternatively, the transceiver 140 can be mounted to the entrance port of the enclosure.

An Electrical Analytics Unit (EAU) 120 (also referred to as a Sensor Analytics Unit (SAU)) can perform local analysis and interpretation of data from the sensors. In one aspect of the present invention, the EAU 120 includes logic (e.g., a logic circuit) that is programmed to perform the incipient FCI logic that detects self-clearing, sub-cycle faults described above, in the form of pre-loaded software/firmware or post-installation loaded software/firmware. In one aspect of this invention, this detection occurs independent of waveform data analysis.

The EAU 120 is also configured to communicate that analyzed data, e.g., via hardwire or a radio disposed therein, to the antenna of the transceiver 140. The EAU 120 can also include an integrated GPS circuit or chip to generate GPS locations signals to the GPS antenna located in the transceiver antenna unit. The integration of GPS capabilities along with time synch events leads to finding key problems with early detection with set thresholds and algorithms for a variety of incipient applications/faults/degradation of key structural or utility components. For example, the EAU 120 can interpret sensor information to determine environmental conditions such as the presence of hazardous gases, moisture, dust, chemical composition, corrosion, pest presence, and more. In addition, the EAU 120 can perform some local actions, such as the opening and closing of switches. Further, the EAU 120 can send aggregated information such as periodic status or asynchronous alarm notifications upstream to another aggregation node and/or to the transceiver, which can forward that information to a cloud server above ground. The EAU 120 can also respond to messages sent to it by an upstream aggregation node or cloud (e.g., SCADA) service. Typical commands from an upstream node or cloud service can include "transmit status," "perform action," "system management," "data logging," "set configuration parameter," "load software," etc.

As shown in FIG. 4, in this example, data from the sensored terminations 110a-110c can be communicated via one or more communication cables 135 (here with multiple cables connected to each sensored termination) to EAU 120. In addition, a series of ground wires 134 can also be provided. The EAU 120 can be mounted at a central location within the enclosure or vault 10, or along a wall or other internal vault structure. In an embodiment of the invention, EAU 120 can include a gateway unit (not separately shown). Alternatively, the gateway unit can be disposed within the transceiver 140 or configured as a stand-alone component.

In a further alternative, the EAU 120 can be disposed outside the enclosure, such as in a vent pipe 15, with extended cables connecting to the one or more sensors disposed within the vault or enclosure. In this alternative aspect, the vent pipe-mounted EAU can be easily accessed by a technician without having to enter the vault or enclosure, or without having to open the entrance port or manhole cover.

As mentioned above, EAU 120 can include appropriate electronics and logic circuits to receive, manipulate, analyze, process, and/or otherwise transform such data signals into signals useable in a supervisory control and data acquisition (SCADA) system. In addition, the logic circuits can perform some operations independently of the SCADA and can be programmed to perform fault identification and detection in accordance with the method described above. In other embodiments, the EAU 120 can also perform isolation, location and condition monitoring and reporting in accord. Moreover, in another aspect, the EAU 120 can be programmed to provide additional features, such as Volt, VAR optimization, phasor measurement (synchnophaser), incipient fault detection, load characterization, post mortem event analysis, signature waveform identification and event capture, self-healing and optimization, energy auditing, partial discharge, harmonics/sub-harmonics analysis, flicker analysis and leakage current analysis.

As mentioned above, EAU 120 can be adapted to process data signals received from sensors 111a-111c and transform such data signals into analyzed data signals which are useable in a supervisory control and data acquisition (SCADA) system. In addition, EAU 120 can also be adapted to receive signals from the SCADA system (via the transceiver 140) to control one or more components or equipment located in the vault. As shown in FIG. 4, data can be communicated between EAU 120 and a transceiver unit 140 (described below) via cable(s) 130, which can comprise one or more conventional cables, such as coaxial cable(s). In addition, power to the transceiver can also be delivered from the EAU via cable(s) 130.

In another aspect, EAU 120 can be configured as a modular or upgradeable unit. Such a modular unit can allow for dongle or separate module attachment via one or more interface ports. For example, multiple sensors can be connected to EAU 120. Such a configuration can allow for the monitoring of power lines and/or a variety of additional environmental sensors which can detect parameters such as gas, water, vibration, temperature, oxygen-levels, etc.). For example, in one alternative aspect, such an additional sensor can comprise a thermal imaging camera to observe a temperature profile of the environment and components within the enclosure. The aforementioned DSP/other chips can provide computational capabilities to interpret, filter, activate, configure, and/or communicate to the transceiver. Dongle or connector blocks can house additional circuitry to create an analog to digital front end. The dongle or connector blocks can also include a plug-n-play electrical circuit for automatically identifying and recognizing the inserted sensing module (and automatically set up proper synchronization, timing, and other appropriate communication conditions).

In another aspect of the invention, the EAU 120 can be implemented with a wireless network radio/transmitter/receiver. Example wireless networks that can be used in an underground location include any combination of WiFi, ZigBee, ANT, Bluetooth, infrared, and others. Thus, EAU 120 can be configured to communicate wirelessly with transceiver 140 and/or the sensors/monitoring devices and/or equipment located in vault 90. This equipment can include sensed terminations or any of the other sensor types previously mentioned with added wireless communication capability.

Further, the EAU 120 can include one or more radios, such as cellular modem, UHF radio (e.g., 900 MHz band), 2.4 GHz, 5.8 GHz, or wifi-mesh, for transmission of the analyzed data through the transceiver antenna to a network SCADA or a service technician outside the enclosure.

In another aspect of the invention, the system 100 can be configured to operate under low power conditions. For example, a power harvester (not shown) can be utilized to provide sufficient power to system 100.

As mentioned above, the FCI detection system 100 can further include a transceiver unit 140 that communicates information from (and to) the sensed termination(s) 110/ EAU 120 to (and from) the above ground SCADA or wireless communications network. In addition, the transceiver unit 140 can further include a visual communication device or system.

In another aspect, the system's FCI logic/functionality can be configured to match the trip logic in protection relays installed on the distribution network that it is monitoring. In this way, the detection and communication system can detect the same faults that caused a relay to switch after a fault.

Thus, the method and system described herein can alert the central server that an incipient fault has occurred and has been detected at a specific location (possibly multiple) with magnitude and accurate timestamp information and can keep track of the number of incipient fault events detected at that location. The system can provide information to a utility that can help them replace failing assets before a catastrophic fault event occurs and customers have to take an outage. This functionality improves the overall grid reliability and can help save time, money, and/or resources related to an outage.

Those skilled in the art will appreciate that various adaptations and modifications of the exemplary and alternative embodiments described herein can be configured without departing from the scope of the invention. Therefore, it is to be understood that, within the scope of the appended claims, the invention may be practiced other than as specifically described herein. For example, the example embodiments described herein may be combined in a variety of ways with each other.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (for example 1 to 5 includes 1, 1.5, 2, 2.75, 3, 3.80, 4, and 5) and any range within that range. Herein, the terms "up to" or "no greater than" a number (for example, up to 50) includes the number (for example, 50), and the term "no less than" a number (for example, no less than 5) includes the number (for example, 5).

Terms related to orientation, such as "end", are used to describe relative positions of components and are not meant to limit the orientation of the embodiments contemplated.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (for example, casting and/or treating an alloy means casting, treating, or both casting and treating the alloy).

The phrases "at least one of," "comprises at least one of," and "one or more of" followed by a list refers to any one of the items in the list and any combination of two or more items in the list.

The invention claimed is:

1. A method of detecting self-clearing, sub-cycle faults, comprising:
    sensing a current condition and a voltage condition at a location along a power cable;
    relaying sensed conditions to an analyzing device, the analyzing device including at least one of a current peak detector, a fast fault detector and high speed sampling;
    determining the presence of a measured current value;
    if the measured current value is greater than a current threshold value, performing a faulted circuit indicator (FCI) analysis to determine the presence or absence of an FCI fault;
    if an FCI fault is absent, performing an incipient fault analysis, wherein the root-mean-square (RMS) current values before and after a threshold event are compared and the voltage total harmonic distortion (THD) before and after the event are compared; and
    wherein if the two current values are within a first predetermined percentage and the THD values differ by a second predetermined percentage, then an incipient fault is reported.

2. The method of claim 1, wherein if either the two current values are not within the first predetermined percentage or the THD values do not differ by at least the second predetermined percentage, an unclassified event is reported.

3. The method of claim 1, wherein, if the first and second current values are within 15% of each other, then reporting a time and location of an incipient fault and a peak current value.

4. The method of claim 1, wherein the first predetermined percentage is about 15% of each other, then reporting as an unclassified event.

5. The method of claim 1, wherein the second predetermined percentage is about 30%.

6. The method of claim 1, wherein circular buffers are used for monitoring THD and RMS current during the time of an incipient fault.

7. A detection system, comprising:
    one or more sensors to detect an electrical condition of a utility asset; and
    an electrical analytics unit that includes logic programmed to perform the method of claim 1.

8. The detection system of claim 7, further comprising a transceiver to communicate analyzed data from the electrical analytics unit to above ground network or SCADA.

* * * * *